(12) United States Patent
Jung

(10) Patent No.: US 12,538,670 B2
(45) Date of Patent: Jan. 27, 2026

(54) ORGANIC LIGHT EMITTING DIODE DISPLAY DEVICE

(71) Applicant: LG DISPLAY CO., LTD., Seoul (KR)

(72) Inventor: Hojin Jung, Daejeon (KR)

(73) Assignee: LG Display Co., Ltd (KR)

( * ) Notice: Subject to any disclaimer, the term of this patent is extended or adjusted under 35 U.S.C. 154(b) by 573 days.

(21) Appl. No.: 17/962,132

(22) Filed: Oct. 7, 2022

(65) Prior Publication Data
US 2023/0189586 A1    Jun. 15, 2023

(30) Foreign Application Priority Data

Dec. 14, 2021    (KR) .................. 10-2021-0178551

(51) Int. Cl.
*H01L 27/32* (2006.01)
*H10K 59/124* (2023.01)
*H10K 59/131* (2023.01)

(52) U.S. Cl.
CPC ......... *H10K 59/131* (2023.02); *H10K 59/124* (2023.02)

(58) Field of Classification Search
None
See application file for complete search history.

(56) References Cited

U.S. PATENT DOCUMENTS

2018/0226467 A1*   8/2018   Ka ................ H10K 59/12

FOREIGN PATENT DOCUMENTS

| KR | 20150105596 A | 9/2015 |
| KR | 2017-0115213 A | 10/2017 |
| KR | 2020-0076581 A | 6/2020 |
| KR | 20200143565 A | 12/2020 |

OTHER PUBLICATIONS

Office Action in Korean Appln. No. 10-2021-0178551, mailed on Nov. 6, 2025, 14 pages (with English translation).

* cited by examiner

*Primary Examiner* — William C Trapanese
(74) *Attorney, Agent, or Firm* — Fish & Richardson P.C.

(57) ABSTRACT

The present disclosure relates to an organic light emitting diode display device, and particularly, is characterized in that when wire traces are exposed while a substrate on which a plurality of display panels are formed is cut into unit panels by a cutting process, the wire traces include a separation area to prevent corrosion and electric erosion of a conductive wire trace from propagating through the exposed wire traces and to resolve a defect in which delamination of an inorganic layer occurs in a cutting process.

17 Claims, 14 Drawing Sheets

ORGANIC LIGHT EMITTING DIODE DISPLAY DEVICE

CROSS-REFERENCE TO RELATED APPLICATION

This application claims the benefit of and priority to Korean Patent Application No. 10-2021-0178551 filed on Dec. 14, 2021 in the Republic of Korea, the entire contents of which are hereby expressly incorporated by reference into the present application.

BACKGROUND

Field of the Disclosure

The present disclosure relates to an organic light emitting diode display device, and in particular, to an organic light emitting diode display device including a wire trace structure that blocks the transmission of external impacts along a wire, which are generated when configuring a bezel portion of a substrate extremely narrowly by removing an edge of the substrate by a cutting process in the organic light emitting diode display device using an organic substrate.

Description of the Background

An assembled display device may include a display panel and a plurality of components for providing various functions, for example, driving circuits for controlling the display panel.

Examples of the driving circuits may include a gate driver, a light emitting device driver, a power supply wire (VDD), an electrostatic discharge (ESD) circuit for blocking static electricity, a multiplex (MUX) circuit, a data signal line, a cathode electrode connection unit, a test pad, and the like. In addition, various types of additional functions, for example, a number of peripheral circuits such as a touch sensing circuit or a fingerprint recognition circuit and the like may be included in a display assembly. Some components may be embedded in the display panel itself or may be mounted on a non-active area in a COF manner.

The latest electronic devices are pursued to have narrow bezels in order to increase immersion in a driven screen. However, embedding many of the components in the display assembly means that the non-active area needs to be widened. This is the opposite of pursuing a narrow bezel.

SUMMARY

Accordingly, there are components which fail to be embedded in a substrate to implement a narrow bezel. For example, test pads may be present on the substrate during a manufacturing process of a display panel, but may be removed in a cutting process after the display panel is completed.

When the test pads are removed in the cutting process, wire traces connected to the test pads are exposed to an outside of a cut surface of the substrate, which may cause corrosion and electric erosion. In addition, there may occur a defect in which an impact generated during the cutting process is transmitted into the display panel along the wire trace.

Accordingly, an aspect of the present disclosure is to prevent transmission of an impact of cutting when display components are formed on a substrate and then cut, and to prevent corrosion and electric erosion from propagating along the wire trace even when the wire trace is exposed to the outside of the cutting surface of the substrate.

An organic light emitting diode display device of the present disclosure includes a substrate including an active area and a non-active area; a thin film transistor disposed in the active area and including a semiconductor pattern, a gate electrode overlapping the semiconductor pattern, and a source electrode and a drain electrode electrically connected to the semiconductor pattern; a planarization layer disposed on the thin film transistor; a light emitting element portion disposed on the planarization layer and connected to the thin film transistor; a plurality of wire traces extending from the non-active area to the active area; and a pad area in which electrode pads connected to the wire traces are disposed in the non-active area, wherein the wire traces include a first portion of the wire trace extending to the active area while being connected to the pad and a second portion of the wire trace extending to an end portion of the substrate, wherein the first portion of the wire trace and the second portion of the wire trace are electrically connected by a connection wire of the wire trace while being separated from each other between the pad area and the end portion of the substrate.

Moreover, the wire trace may include a conductive wire trace, at least one interlayer insulating layer covering the conductive wire trace, and at least one lower insulating layer disposed between the substrate and the conductive wire trace.

The at least one interlayer insulating layer and the at least one lower insulating layer may include an inorganic material.

The first portion of the wire trace and the second portion of the wire trace may be separated from each other between the pad area and the end portion of the substrate by removing the conductive wire trace and the at least one interlayer insulating layer and the at least one lower insulating layer.

An organic protective layer pattern may be disposed on the connection wire of the wire trace.

The at least one lower insulating layer and the at least one interlayer insulating layer may be removed between the second portions of the wire traces adjacent to each other to thereby expose the substrate.

The substrate may be covered by the at least one lower insulating layer or the at least one interlayer insulating layer between the first portions of wire traces adjacent to each other.

The conductive wire trace may include at least one of conductive materials disposed between the semiconductor pattern and the light emitting element portion.

The conductive wire trace may be formed of the same material as the gate electrode.

The connection wire of the wire trace may include at least one of conductive materials disposed between the gate electrode and the light emitting element portion.

The connection wire of the wire trace may be formed of the same material as the source electrode and the drain electrode.

The electrode pad may include at least one of conductive materials disposed between the semiconductor pattern and the light emitting element portion.

The organic protective layer pattern may be formed of the same material as the planarization layer.

The second portion of the wire trace may be exposed from the end portion of the substrate.

In an organic light emitting diode display device of the present disclosure, when a display panel is completed by forming various display components on a substrate and then, the display panel is cut into respective unit display panels, even if corrosion and electric erosion of wire traces exposed to a cut surface occur, it is possible to prevent propagation of corrosion and electric erosion along the wire traces to an active area. In addition, when a substrate formed of glass or the like is cut into each unit panel, it is possible to prevent occurrence of defects such as damage to an inorganic layer and the like, which are vulnerable to physical impacts as an impact of cutting is transmitted to an inside of the active area.

DETAILED DESCRIPTION

Figure 1:
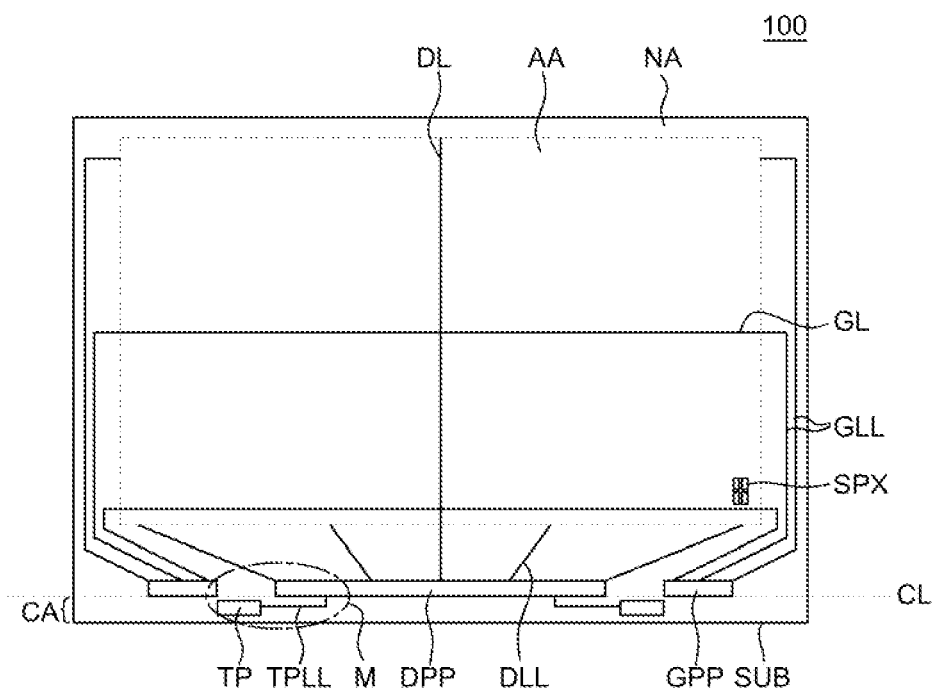
FIG. 1 is a plan view of a display panel of the present disclosure.

Advantages and features of the present disclosure, and methods for accomplishing the same will be more clearly understood from aspects described below with reference to the accompanying drawings. However, the present disclosure is not limited to the following aspects but may be implemented in various different forms. The aspects are provided only to complete disclosure of the present disclosure and to fully provide a person having ordinary skill in the art to which the present disclosure pertains with the scope of the disclosure.

The shapes, sizes, ratios, angles, numbers, and the like illustrated in the accompanying drawings for describing aspects of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring a subject matter of the present disclosure.

The terms such as "including," "having," and "comprising" used herein are generally intended to allow other components to be added unless the terms are used with the term "only". Any references to singular may include plural unless expressly stated otherwise.

Components are interpreted to include an error range even if not expressly stated.

For example, when a positional relationship between two parts is described using the terms such as "on", "above", "below", and "next", one or more other parts may be positioned between the two parts unless the terms are used with the term "immediately" or "directly".

Spatially relative terms "below", "beneath", "lower", "above", "upper" and the like may be used to easily describe relationships between one element or component and another element or component. The spatially relative terms should be understood as terms including different orientations of a device during use or operation in addition to an orientation shown in the drawings. For example, if an element shown in the drawings is turned over, an element described as being "below" or "beneath" another element may be placed "above" the other element. Accordingly, the exemplary term "below" or "beneath" may include both directions "below" and "above". Likewise, the exemplary term "above" or "on" may include both directions "above" and "below".

In describing a time relationship, for example, when a temporal order is described as 'after ~', 'subsequent ~', 'next~', and 'before ~', a case which is not continuous may be included unless 'just' or 'direct' is used.

Although the terms "first", "second", and the like may be used herein to describe various elements, these elements should not be limited by these terms. These terms are only used to distinguish one element from another element. Thus, a first element mentioned below may be a second element within the technical idea of the present disclosure.

The term "at least one" should be understood as including any and all combinations of one or more of the associated listed items. For example, the meaning of "at least one of a first item, a second item, and a third item" denotes the combination of all items that may be proposed from two or more of the first item, the second item, and the third item as well as the first item, the second item, or the third item.

Features of various aspects of the present disclosure may be partially or overall coupled to or combined with each other and may be variously inter-operated with each other and driven technically, and respective aspects of the present disclosure may be carried out independently from each other, or may be carried out together in association with each other.

When adding reference numerals to components of respective drawings describing aspects of the present disclosure, the same elements may be denoted by the same reference numerals as much as possible even though they are depicted in different drawings.

In aspects of the present disclosure, a source electrode and a drain electrode are merely distinguished for convenience of description, and the source electrode and the drain electrode may be interchanged. The source electrode may be the drain electrode, and the drain electrode may be the source electrode. In addition, the source electrode of one aspect may be a drain electrode in another aspect, and the drain electrode of one aspect may be a source electrode in another aspect.

In some aspects of the present disclosure, for convenience of description, a source region and a source electrode are distinguished and a drain region and a drain electrode are distinguished, but aspects of the present disclosure are not limited thereto. The source area may be a source electrode, and the drain area may be a drain electrode. Also, the source area may be the drain electrode, and the drain area may be the source electrode.

Features of various aspects of the present disclosure may be partially or overall coupled to or combined with each other and may be variously inter-operated with each other and driven technically by a person having ordinary skill in the art, and respective aspects of the present disclosure may be carried out independently from each other, or may be carried out together in association with each other.

Hereinafter, various aspects of the present disclosure will be described in detail with reference to the accompanying drawings.

FIG. 1 is a plan view of a display panel 100 according to aspects of the present disclosure.

The at least one display panel 100 may be formed on substrate and then each panel may be separated using various techniques. The display panel 100 of FIG. 1 includes an active area AA provided on a substrate (or a base substrate) 301 and a non-active area NA disposed around the periphery of the active area AA. FIG. 1 provides illustration with inclusion of a cut-out area CA adjacent to the display panel 100. The cut-out area CA is formed on a substrate like the display panel 100 and then is separated and removed from the display panel 100 in a cutting process.

In one aspect, the substrate 301 may be formed of a plastic material having flexibility, but other aspects of the present disclosure include a rigid substrate, such as glass. When glass is used as the substrate, the substrate has superior ability to withstand high temperatures during a manufacturing process of the display panel 100 than the plastic substrate, and it is easy to maintain flatness thereof during the manufacturing process and a cost thereof is low.

The active area AA is an area in which sub-pixels SPX are disposed in a matrix form. A plurality of thin film transistors are disposed in the sub-pixels SPX. In the thin film transistor, a polycrystalline semiconductor pattern may be used as an active layer or an oxide semiconductor pattern may be used as the active layer.

A plurality of data wires DL and a plurality of gate wires GL may be disposed in the active area AA. For example, the plurality of data wires DL may be disposed in rows or columns, and the plurality of gate wires GL may be disposed in columns or rows. In addition, the sub-pixels SPX may be disposed in an area defined by the data wire DL and the gate wire GL.

A gate pad portion GPP on which a gate driver (not shown), which may include a gate driving circuit, may be mounted may be disposed in the non-active area NA. The gate driving circuit sequentially drives respective pixel rows in the active area AA by sequentially supplying a scan signal to the plurality of gate wires GL. In some cases, the gate driving circuit may also be referred to as a scan driving circuit. The pixel row refers to a row formed by pixels connected to one gate wire GL. The gate driving circuit may be implemented as a gate in panel (GIP) type and disposed directly on the substrate 301.

The gate driver (not shown) including the gate driving circuit sequentially supplies a scan signal of an on-voltage or an off-voltage to the plurality of gate wires.

In addition, the non-active area NA includes a data pad portion DPP on which a data driver (not shown) including a data driving circuit may be mounted. When a specific gate wire is activated by the gate driver, the data driving circuit converts image data into a data voltage in an analog form and supplies it to the plurality of data wires.

According to an aspect of the present disclosure with reference to FIG. 1, the gate driver and the data driver may be mounted on a flexible printed circuit board (FPCB) in a chip on film (COF) method, and the flexible printed circuit board (FPCB) may be mounted on the gate pad portion GPP and the data pad portion DPP disposed in the non-active area NA.

The gate pad portion GPP and the data pad portion DPP are areas in which a plurality of electrode pads are disposed, and the upper ends thereof are exposed to be in electrical contact with a bumper 351 of the flexible circuit board FPCB.

The electrode pads are respectively connected to the data wire DL and the gate wire GL of the active area AA by data link wires DLL and gate link wires GLL.

Meanwhile, the cut-out area CA, which is cut and removed after the display panel 100 is completed, is located in an outer portion of the non-active area NA. A test pad TP capable of performing an auto probe test during the manufacturing process of the display panel 100 is disposed in the cut-out area CA. The test pad TP may be connected to the electrode pads through a test wire TPLL and provide a test signal to the active area AA.

However, when the cut-out area CA is cut and removed from an array substrate SUB to implement a narrow bezel, the test wire TPLL may be exposed to the outside. Referring to FIG. 1, a cutting line CL goes through between the test pad TP and the data pad portion DPP.

In addition, because a surface of the array substrate SUB is in a very rough state for the cutting process, it is necessary to grind the surface of the substrates. Accordingly, the array substrate SUB is partially ground by a grinder. In some cases, the test wire TPLL that is exposed to the outside may be exposed to corrosion and electric erosion during the grinding proces. In addition, in a grinding process, insulating layers, particularly, inorganic insulating layers around the test wire TPLL are destructed by impacts, and cracks may propagate into the active area AA. Aspects of the present disclosure provides a wire trace structure to resolve corrosion or electric erosion defects during and after the cutting process and prevent the transmission of external impacts into the active area.

Figure 2:
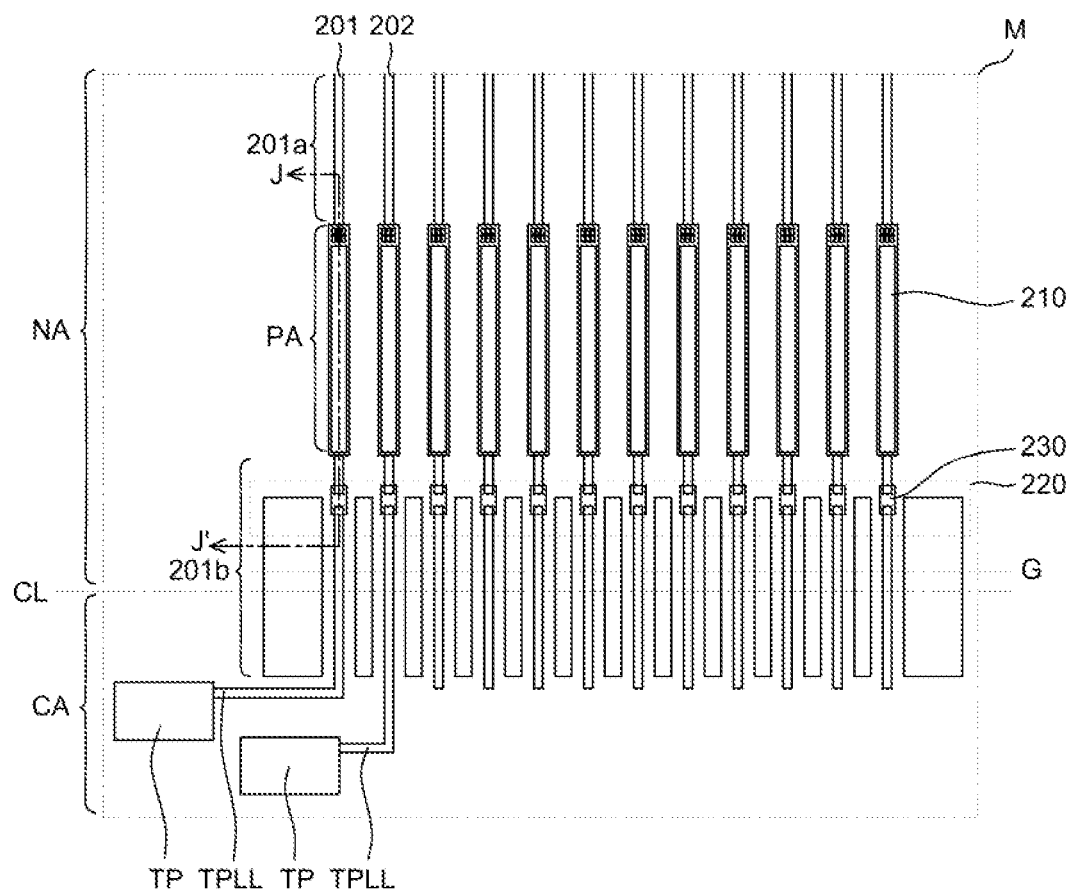
FIG. 2 is an enlarged view of the area M of the display panel illustrated in FIG. 1.
Figure 3:
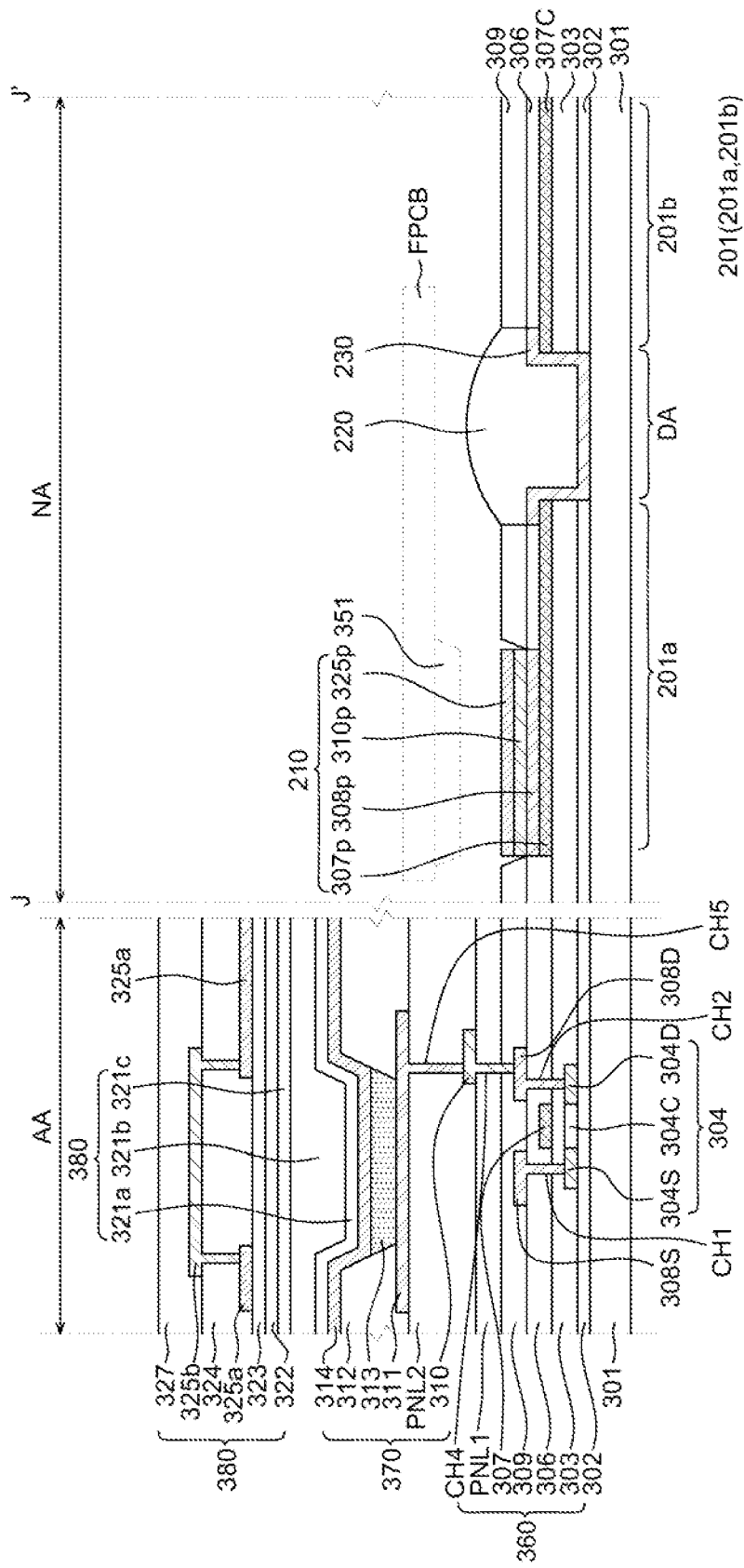
FIG. 3 illustrates a cross-sectional view of a sub-pixel of an active area and a cross-sectional view of a wire trace taken along cutting line J-J' in FIG. 2.

A more detailed description will be provided with reference to FIGS. 2 and 3 in which area M of FIG. 1 is enlarged.

Various conductive wires are required to electrically connect various components in the display panel 100 to each other. Circuits in the active area AA and the non-active area NA may transmit and receive various signals through one or more conductive wires to provide various functions to the display panel 100.

In the present disclosure, a conductive wire trace generally refers to a conductive path for transmitting an electrical signal from one point to another point on a substrate. Such a conductive wire trace may include the gate wires and the data wires that transmit signals from driving circuits (e.g., the gate driving circuit and the data driving circuit) that may be disposed in the non-active area NA, as well as a source electrode and a drain electrode of the thin film transistor. In addition, when touch sensor electrodes are disposed in the display panel 100, the conductive wire trace may include a touch input signal wire and a touch reception signal wire.

In particular, according to an exemplary aspect of the present disclosure, inorganic materials that may be located on and below the conductive wire trace, in which cracks may easily occur during a cutting process, together with the conductive wire trace. For purpose of clarity, a conductive wire trace that is a trace of a conductive wire and a trace that is a trace of insulating materials disposed on and below the conductive wire trace will be referred to as a wire trace.

Referring to FIG. 2, a plurality of wire traces 201 and 202 are disposed in the non-active area NA. The wire trace 201 may be the data link wire or the gate link wire in the non-active area NA, and may be the data wire or the gate wire in the active area AA.

Referring to FIG. 2, the area M is divided into the non-active area NA and the cut-out area CA based on the cutting line CL. After the array substrate SUB is cut, a certain portion thereof is further removed by grinding a cut surface. For example, line G of FIG. 2 is a grinding line that identifies a path of a grinder.

The wire trace 201 includes a first portion 201a of the wire trace that extends toward the active area AA and the test wire TPLL of the cut-out area CA. A second portion 201b of the wire trace 201 extends toward an end portion of the array substrate SUB.

Also, a pad area PA, which includes a plurality the electrode pads, is disposed on the first portion 201a of the wire trace 201. Electrode pads 210 are respectively connected to the wire traces 201 and 202 in a one-to-one manner. A flexible printed circuit board FPCB on which various driving chips are mounted may be mounted on the pad area PA.

In some aspects, a separation area DA (not shown) for separating the first portion 201a of the wire trace and the second portion 201b of the wire trace may be disposed between the pad area PA and the second portion 201b of the wire trace 201. The separation area DA is illustrated in FIG. 3 to illustrate blocking particles and other effects that may cause corrosion or electric erosion that are associated with the cutting process.

The separation area DA blocks corrosion or electric erosion from being transmitted through the second portion 201b of the wire trace that is exposed to the outside. In addition, the separation area DA prevents an impact, which can be generated while grinding the cut surface of the array substrate SUB, from being transmitted into the active area AA through the wire trace 201. As noted above, The impact generated during the grinding process is may transmit through an inorganic layer and cause delamination of the inorganic layer.

In some aspects, the separation area DA is formed by removing the trace of the conductive wire and inorganic layers positioned on and below the trace of the conductive wire that constitute the wire trace 201. The separation area DA will be described in more detail with reference to FIG. 3.

FIG. 3 discloses a cross-sectional view of a sub-pixel in the active area AA and a cross-sectional view of one wire trace 201 disposed in the non-active area NA.

The separation area DA physically separates the first portion 201a of the wire trace 201 and the second portion 201b of the wire trace from each other.

As illustrated in FIG. 3, the separation area is a recessed portion within the non-active area NA. In some aspects, the separation area DA is formed by removing layers constituting the wire trace 201, that is, a conductive wire trace 307C, inorganic layers (e.g., a lower buffer layer 302 and a gate insulating layer 303) disposed between the conductive wire trace 307C and the base substrate 301, and inorganic layers (e.g., a first interlayer insulating layer 306 and a second interlayer insulating layer 309) disposed on the conductive wire trace 307C.

In addition, the separation area DA further includes a connection wire 230 that is configured separately from the conductive wire trace 307C.

The connection wire 230 electrically connects the separated first portion 201a of the wire trace and the separated second portion 201b of the wire trace to each other. As the connection wire 230, a metal layer formed on a gate electrode 307 may be used. For example, the connection wire 230 may be formed of a metal material constituting the source and drain electrodes or a metal material constituting a connection electrode 310 that connects the source and drain electrodes and an anode electrode to each other may be used. It is also possible to use both of them. Accordingly, since the wire trace 201 includes the separation area DA in a connected state through the connection wire 230, the wire trace 201 may receive a test signal from the test pad TP that is installed outside the array substrate SUB and transmit the test signal to the active area AA.

In addition, the separation area DA covered by an organic protective layer pattern 220 that is formed of an organic material to prevent external moisture permeation. The organic protective layer pattern 220 may also insulate an impact and prevent an impact from being transmitted into the separation area DA. In some cases, the organic protective layer pattern 220 may be formed of the same material as planarization layers PLN1 and PLN2 in a process of forming the planarization layers PLN1 and PLN2 formed in the sub-pixels.

Referring to FIGS. 2 and 3, the first portion 201 a of the wire trace is electrically connected to the electrode pad 210. As described above, the electrode pad 210 is a portion where the flexible printed circuit board (FPCB) is mounted, and the FPCB may have various chips are mounted onto at least one surface. In some cases, the electrode pad 210 is exposed so that the flexible printed circuit board (FPCB) can be mounted thereon.

The electrode pads 210 are connected to the wire traces 201 in a one-to-one correspondence.

A cross-sectional structure of the electrode pad 210 will be described with reference to FIG. 3.

The electrode pad 210 may be configured by stacking a plurality of metal layers. Referring to FIG. 3, the electrode pad 210 may be configured by stacking a portion 307p of the first portion 201a of the wire trace, a portion 308p of a metal layer forming the source and drain electrodes, and a portion 310p of a metal layer forming the third electrode pad layer on one another. Also, referring to FIG. 3, when the display panel 100 includes a touch panel embedded therein, the electrode pad 210 may further include a portion 325p of a metal layer constituting the touch panel.

Meanwhile, the relationship between respective layers will be described with reference to FIG. 3, through a cross-sectional view of one sub-pixel in the active area AA and a cross-sectional view of the wire trace 201 taken along cutting line J-J' illustrated in FIG. 2.

FIG. 3 illustrates a cross-sectional stacked structure of the sub-pixel SPX. The sub-pixel SPX includes a pixel circuit portion 360 disposed on the base substrate 301, a light emitting element portion 370 electrically connected to the pixel circuit portion 360, and an encapsulation layer portion 380 on the light emitting element portion 370. The pixel circuit portion 360 and the light emitting element portion 370 are insulated by the planarization layers PLN1 and PLN2. When a touch panel 390 is embedded in the active area AA, the touch panel 390 may be further formed on the encapsulation layer portion 380.

In this aspect, the pixel circuit portion 360 refers to a circuit for driving one sub-pixel SPX. The circuit can include a plurality of thin film transistors (e.g., a driving thin film transistor and a switching thin film transistor) and a storage capacitor. The light emitting element portion 370 refers to an array portion for light emission and includes an anode electrode, a cathode electrode, and a light emitting layer disposed therebetween. Also, the encapsulation layer portion 380 refers to an encapsulation layer in which a plurality of inorganic and organic layers are stacked.

FIG. 3 discloses a cross-sectional view of one thin film transistor among the plurality of thin film transistors. However, FIG. 3 only discloses an exemplary aspect of the present disclosure, but is not limited thereto. For example, the plurality of thin film transistors may be polysilicon thin film transistors using a polycrystalline semiconductor pattern as an active layer, oxide semiconductor thin film transistors using an oxide semiconductor pattern as an active layer, or a combination thereof. In some aspects, the plurality of thin film transistors may be thin film transistors using an amorphous semiconductor pattern as an active layer.

FIG. 3 illustrates a thin film transistor using a polycrystalline semiconductor pattern as an active layer as an example.

The thin film transistor includes a polycrystalline semiconductor pattern 304 that is disposed on the lower buffer layer 302 formed on the base substrate 301, the gate insulating layer 303 that insulates the polycrystalline semiconductor pattern 304, the gate electrode 307 that is disposed on the gate insulating layer 303 and overlaps the polycrystalline semiconductor pattern 304, the first interlayer insulating layer 306 that is formed on the gate electrode 30, and a source electrode 308S and a drain electrode 308D that are disposed on the first interlayer insulating layer 306.

The base substrate 301 may be configured as a multi-layer structure in which an organic layer and an inorganic layer are alternately stacked. For example, the base substrate 301 may be formed by alternately stacking an organic layer such as polyimide and an inorganic layer such as silicon oxide (SiO2). However, an exemplary aspect of the present disclosure will be described by way of an example in which a glass substrate is used as the base substrate 301. When a glass substrate is used as the base substrate 301, a grinding process of grinding an edge thereof is required after a cutting process. During the cutting process, transmission of impacts can cause delamination of the inorganic layer occurs along the wire trace.

Figure 5A:
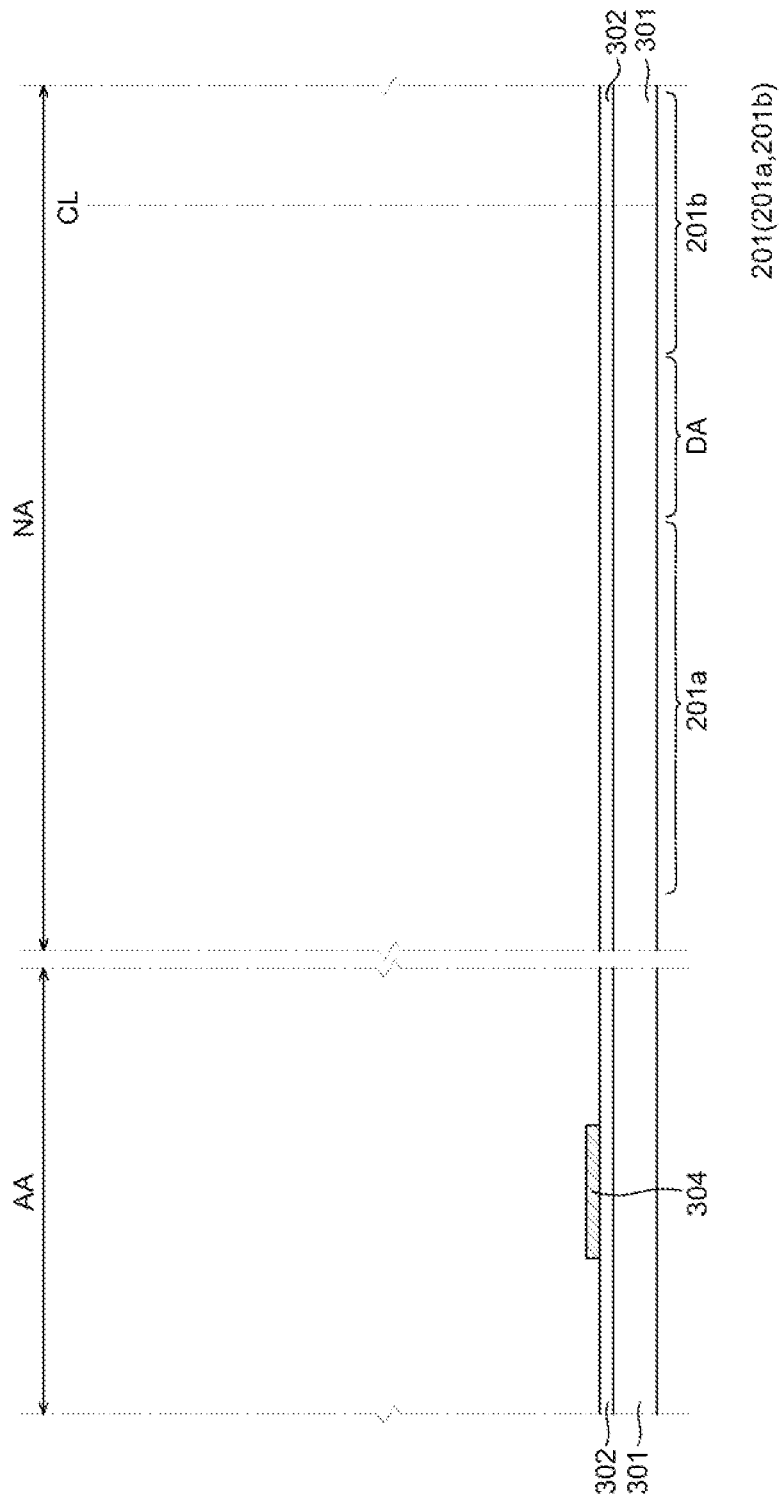
FIGS. 5A to 5H are cross-sectional views illustrating a manufacturing process of an organic light emitting diode display device according to the present disclosure.

Referring to FIG. 5A, the lower buffer layer 302 is formed on the base substrate 301. The lower buffer layer 302 is configured to block moisture or the like that can penetrate from the outside and may be used by stacking a silicon oxide (SiO2) film in multiple layers. The lower buffer layer 302 is formed in the entirety of the active area AA and the non-active area NA.

The polycrystalline semiconductor pattern 304 is formed on the lower buffer layer 302. The polycrystalline semiconductor pattern 304 is formed of a polycrystalline semiconductor and includes a channel region 304C through which charges move, and a source region 304S and a drain region 304D that are adjacent to the channel region 304C with the channel region 304C interposed therebetween. The source region 304S and the drain region 304D are conductive regions by doping impurity ions such as phosphorus or boron in the polycrystalline semiconductor pattern.

Figure 5B:
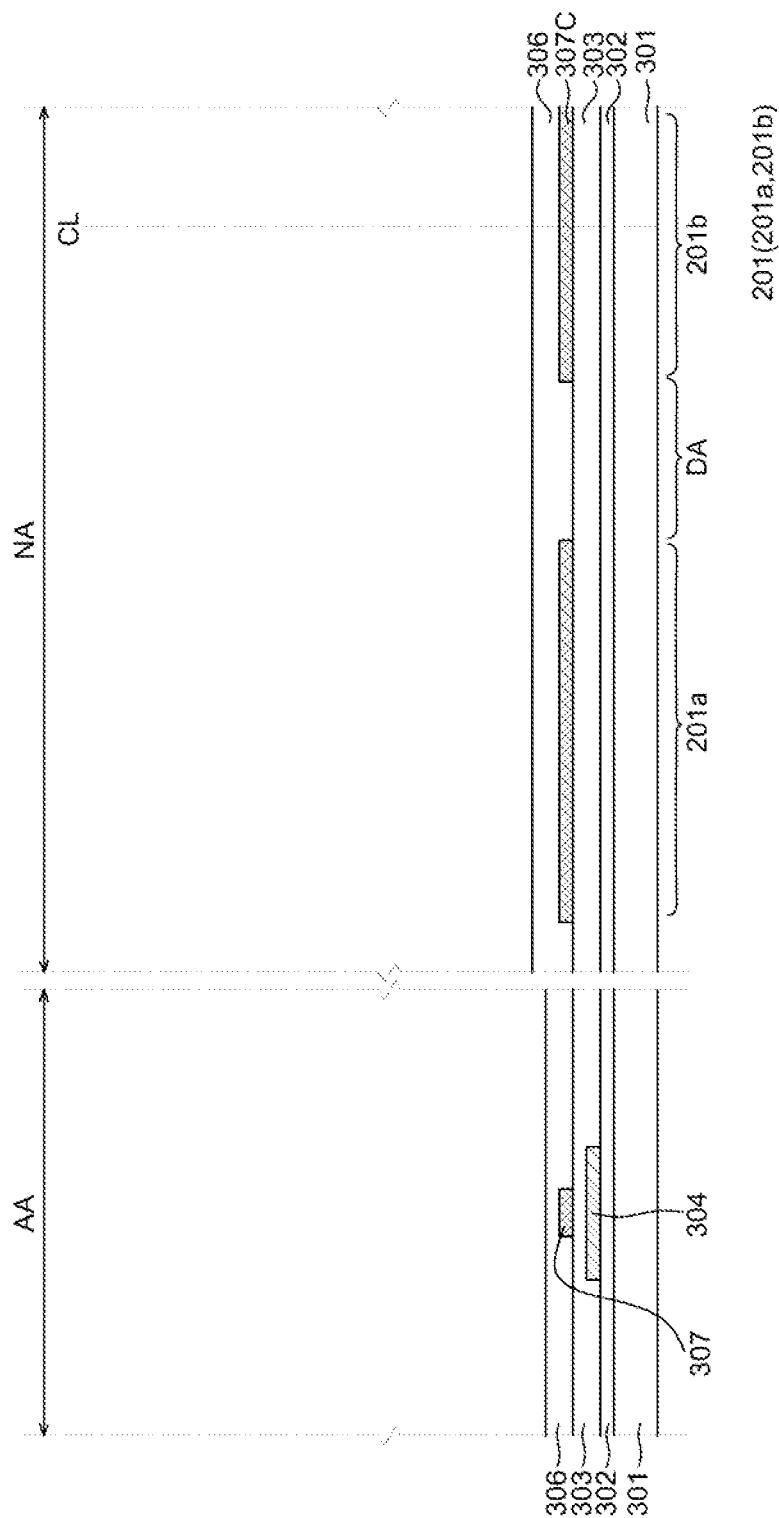

Referring to FIG. 5B, the polycrystalline semiconductor pattern 304 is insulated by the gate insulating layer 303. The gate insulating layer 303 is formed by depositing an inorganic insulating layer such as silicon oxide (SiO2) on the entire surface of the non-active area NA and the active area AA in which the polycrystalline semiconductor pattern 304 is formed. The gate insulating layer 303 protects and insulates the polycrystalline semiconductor pattern 304 from the outside.

The gate electrode 307 may be formed of a metal material. For example, the gate electrode 307 may be a single layer or multiple layers formed of any one of molybdenum (Mo), aluminum (Al), chromium (Cr), gold (Au), titanium (Ti), nickel (Ni), neodymium (Nd), and copper (Cu) or an alloy thereof, but is not limited thereto.

However, in an exemplary aspect of the present disclosure, it is preferable form the gate electrode with a molybdenum (Mo) metal material. In some aspects, molybdenum (Mo) has high conductivity and excellent ductility. Thus, when the wire trace 201 is configured using molybdenum (Mo), fragments rarely occur during a separation process (e.g., sawing, cutting, etc.) of the array substrate SUB, and reduces a delamination phenomenon of the inorganic layer. However, the gate electrode is not limited to a molybdenum metal material to form the gate electrode and the wire trace, and the gate electrode can be formed using a conductive material having high ductility and high conductivity.

The gate electrode 307 is disposed on the gate insulating layer 303 to overlap the channel region 304C. In this case, the conductive wire trace 307C is formed on the gate insulating layer 303 in the non-active area NA. The conductive wire trace 307C may constitute a first electrode pad layer 307p in the pad area PA. At this time, the conductive wire trace 307C in the separation area DA is separated using a process (e.g., an etch) into the first portion 201a of the wire trace and the second portion 201b of the wire trace.

The first interlayer insulating layer 306 may be formed between the gate electrode 307 and the source electrode 308S and the drain electrode 308D.

The first interlayer insulating layer 306 may be formed of a single layer and may also be formed of a multilayer. The first interlayer insulating layer 306 may be a silicon oxide layer (SiO2) or a silicon nitride layer (SiNx) and may have a stacked structure thereof. The first interlayer insulating layer 306 is also formed in the non-active area NA and covers the conductive wire trace 307C.

The source electrode 308S and the drain electrode 308D are formed on the first interlayer insulating layer 306. When the source electrode 308S and the drain electrode 308D are formed in the active area AA, a second electrode pad layer 308p may be formed as a conductive layer constituting the source electrode 308S and the drain electrode 308D in the pad area PA. In addition, the connection wire 230, which connects the conductive wire traces that are separated from each other, is formed in the separation area DA.

Figure 5C:
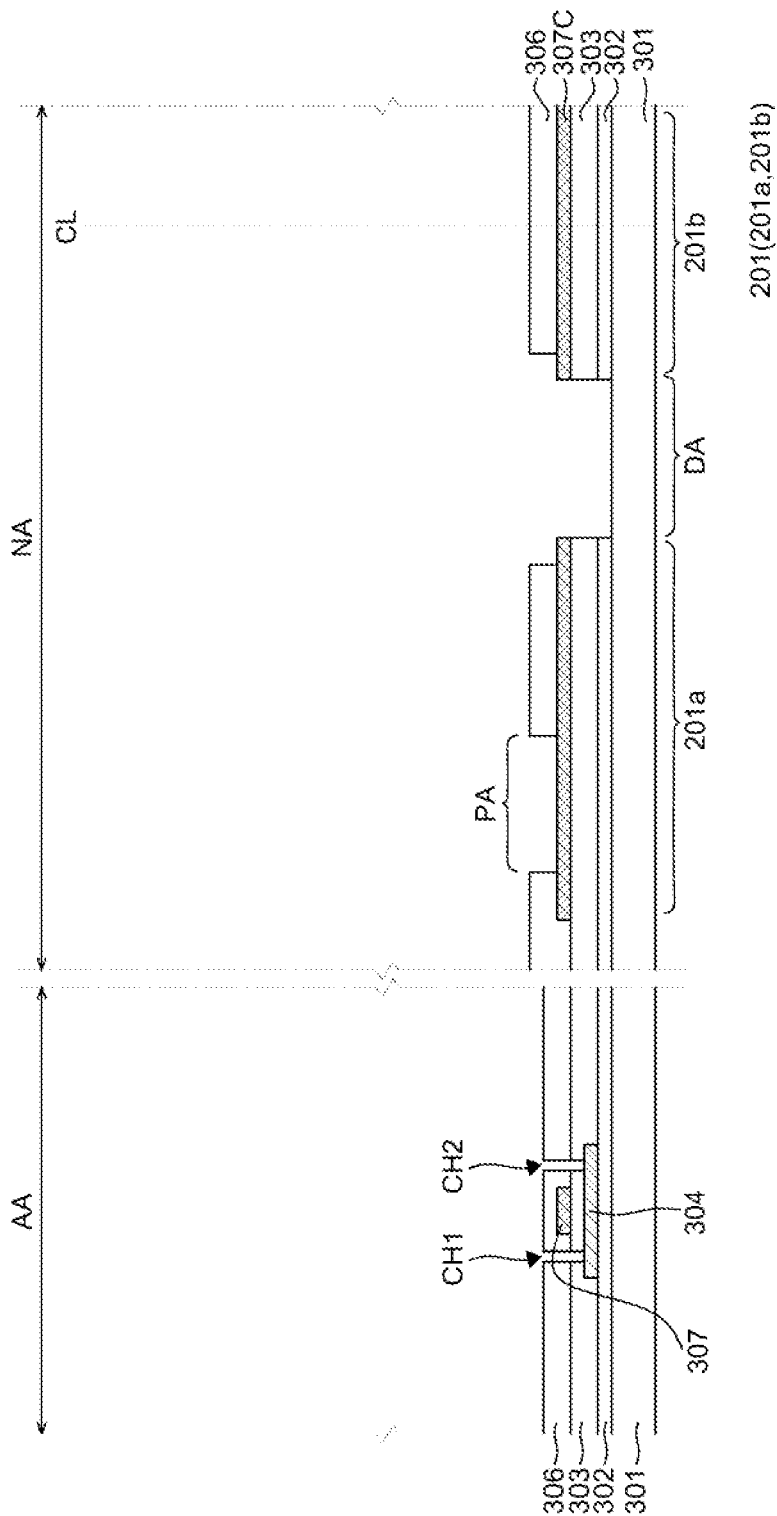

Referring to FIG. 5C, before forming the source electrode 308S and the drain electrode 308D on the first interlayer insulating layer 306, a first contact hole CH1 and a second contact hole CH2 that expose the source region 304S and the drain region 304D of the polycrystalline semiconductor pattern 304 are formed. At this time, the first interlayer insulating layer 306 formed on the pad area PA is removed, and the lower buffer layer 302, the gate insulating layer 303, and the first interlayer insulating layer 306 are removed from the separation area DA.

Figure 5D:
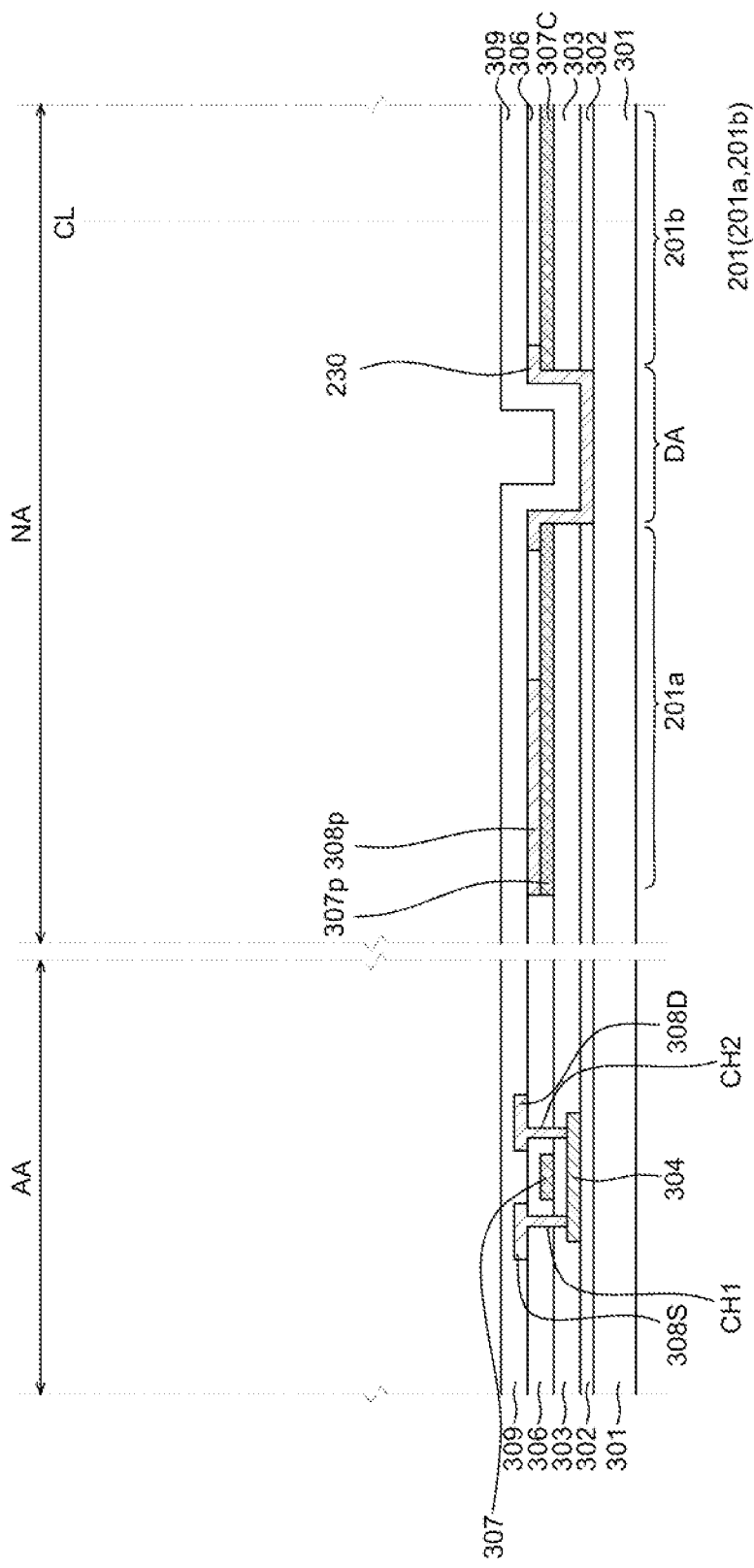

FIG. 5D illustrates a result of removing the materials from the pad area PA and the separation DA. As illustrated in FIG. 5D, the first electrode pad layer 307p and the second electrode pad layer 308p may be electrically connected to each other in the pad area PA. Also, at this time, in the separation area DA, the connection wire 230 connects the first portion 201a of the wire trace and the second portion 201b of the wire trace that are separated from each other.

The first contact hole CH1 and the second contact hole CH2 penetrate the gate insulating layer 303 and the first interlayer insulating layer 306 over the polycrystalline semiconductor pattern 304, so that the source region 304S and the drain region 304D are exposed.

The second interlayer insulating layer 309 is formed over the source electrode 308S and the drain electrode 308D. The second interlayer insulating layer 309 is formed in the entirety of the active area AA and the non-active area NA. The second interlayer insulating layer 309 may be formed of silicon oxide (SiO2) or silicon nitride (SiNx).

Figure 5E:
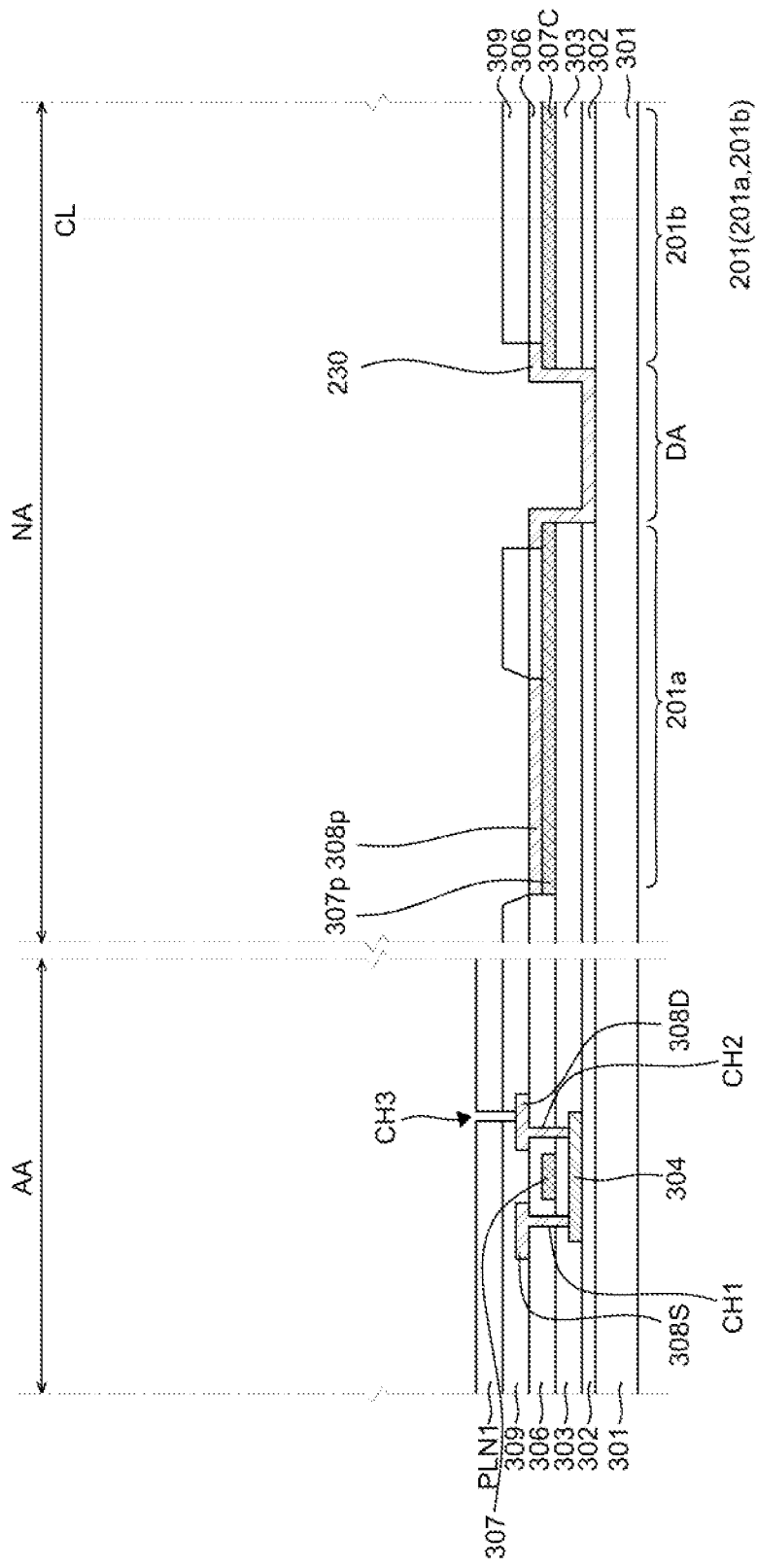

Referring to FIG. 5E, the second interlayer insulating layer 309 includes a third contact hole CH3 exposing the source electrode 308S or the drain electrode 308D. When the third contact hole CH3 is formed, the second interlayer insulating layer 309, which is deposited on the pad area PA, and the second interlayer insulating layer 309, which is deposited on the separation area DA, are removed together.

A first planarization layer PLN1 for planarizing the surface of the array substrate SUB is formed over the second interlayer insulating layer 309.

Figure 5F:
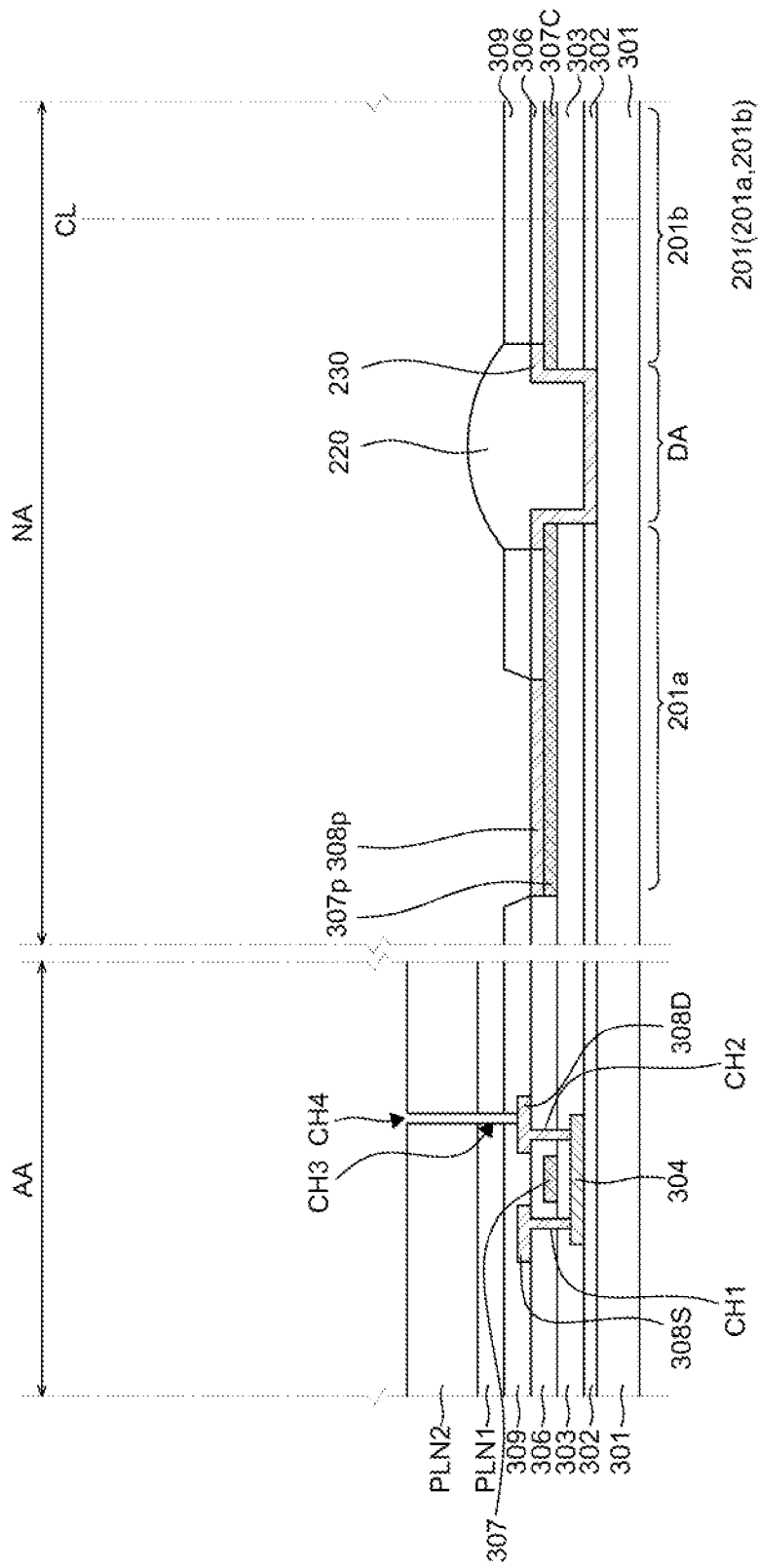

Referring to FIG. 5F, the first planarization layer PLN1 includes a fourth contact hole CH4 that is aligned with the third contact hole CH3. When the fourth contact hole CH4 is formed, the organic protective layer pattern 220 covering the separation area DA may be formed in the separation area DA.

The first planarization layer PLN1 may be formed of an organic material such as photoacrylic. The connection electrode 310 is formed on the first planarization layer PLN1.

Figure 5G:
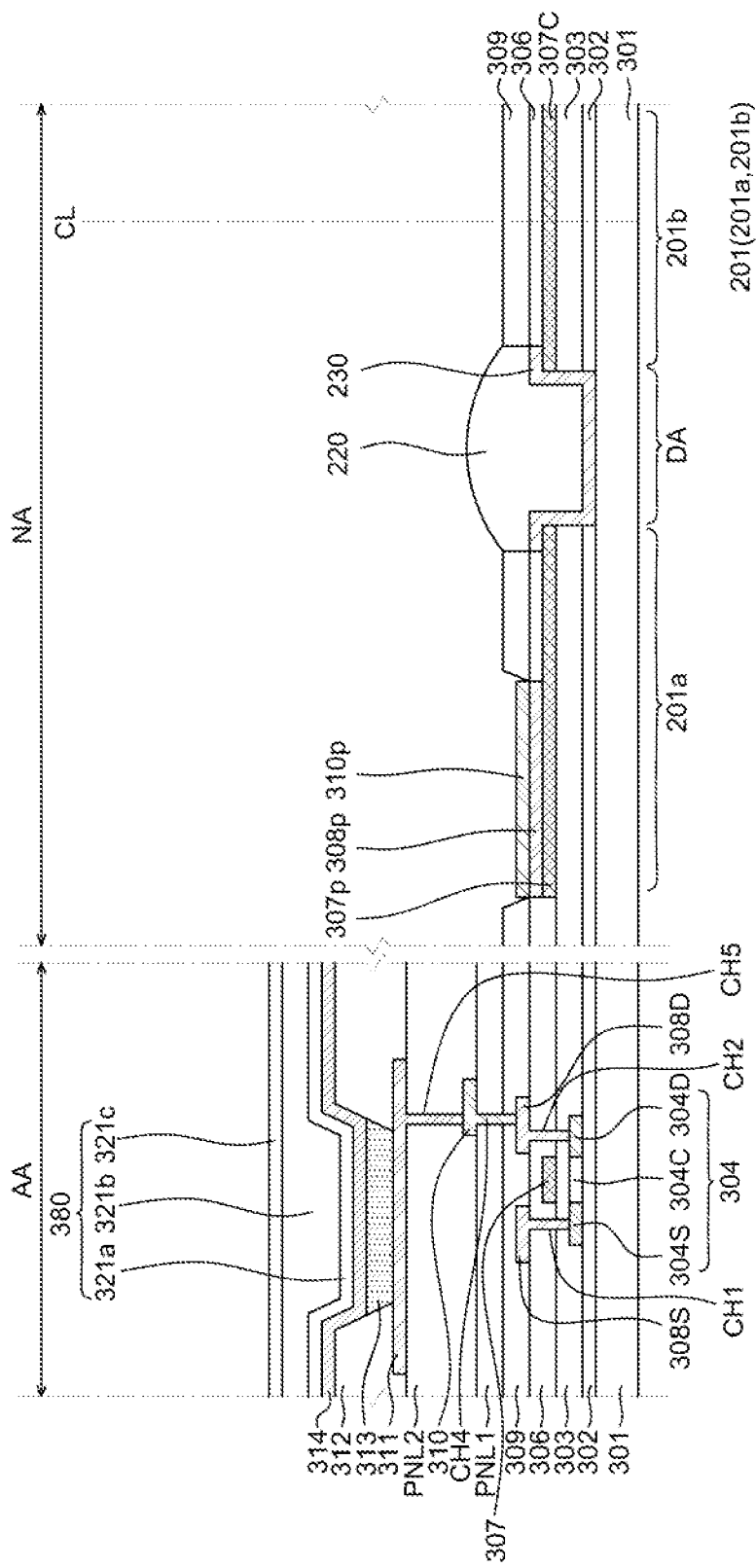
Figure 5H:
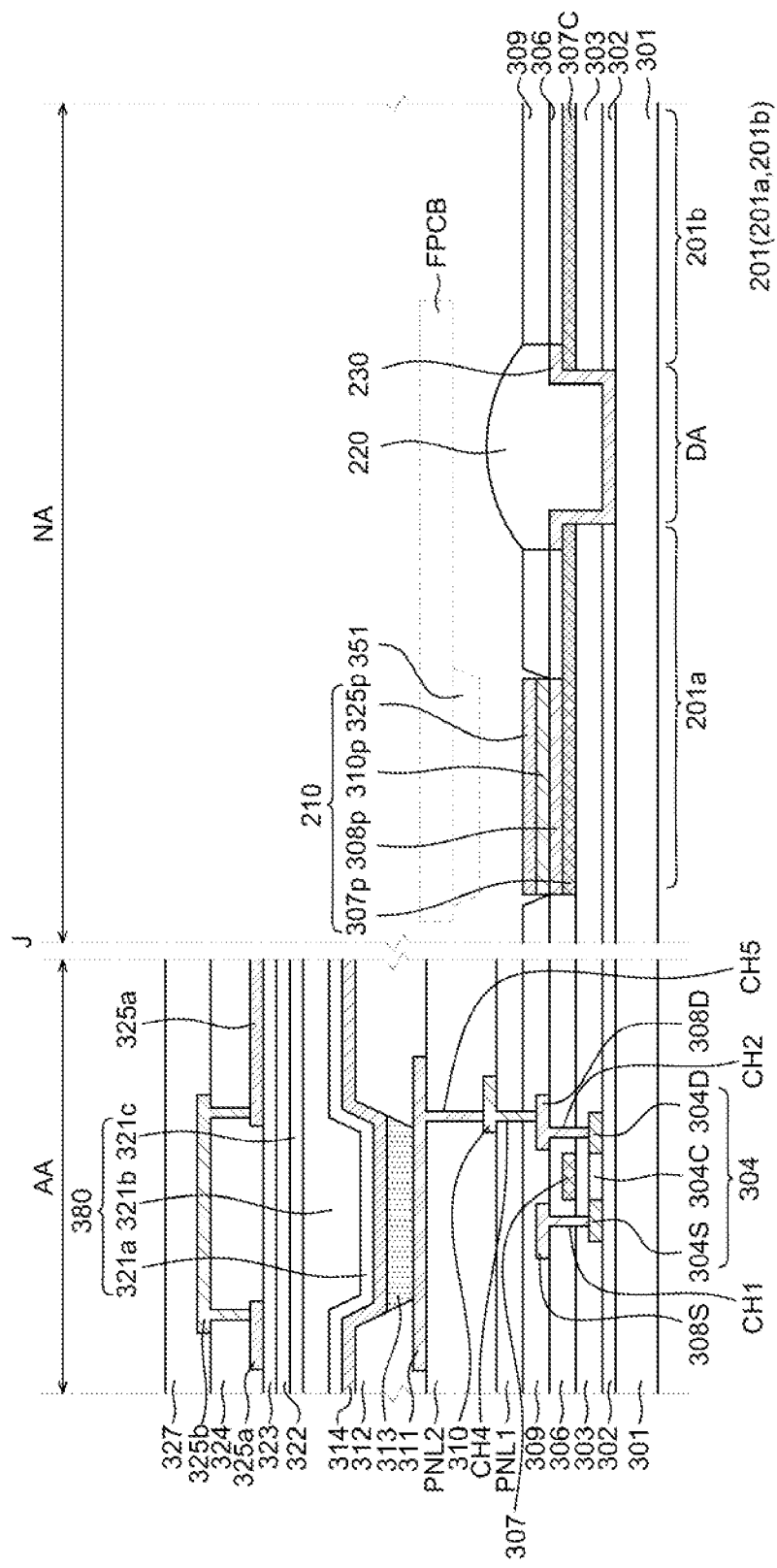

Referring to FIG. 5G, the connection electrode 310 electrically connects an anode electrode 311, which is a component of the light emitting element portion 370, and the thin film transistor. When the connection electrode 310 is formed, a third electrode pad layer 310p may be formed on the pad area PA.

A second planarization layer PLN2 may be formed on the connection electrode 310. The second planarization layer PLN2 may be formed of an organic material such as photoacrylic, similar to the first planarization layer PLN1, and may also include a plurality of layers including an inorganic layer and an organic layer.

The anode electrode 311 that is electrically connected to the drain electrode 308D of the thin film transistor through a fifth contact hole CH5 is formed on the second planarization layer PLN2. The anode electrode 311 is formed of a single layer or a plurality of layers formed of a metal such as Ca, Ba, Mg, Al, Ag, or an alloy thereof, and is connected to the drain electrode 308D of the thin film transistor to thereby receive an image signal from the outside.

When the second planarization layer PLN2 is formed, an organic protective layer pattern formed of the second planarization layer PLN2 may be further formed in the separation area DA. That is, the organic protective layer pattern 220 may have a stacked structure of the first planarization layer PLN1 and the second planarization layer PLN2.

A bank layer 312 is formed on the second planarization layer PLN2. The bank layer 312 is a kind of wall portion and partitions each sub-pixel and isolates a color. For example, the bank layer prevents specific colors that are output from the sub-pixels adjacent to each other from being mixed during output.

An organic light emitting layer 313 is formed on the anode electrode 311 and on a partial area of an inclined surface of the bank layer 312. The organic light emitting layer 313 may be an R-organic light emitting layer that is formed in each sub-pixel and emits red light, a G-organic light emitting layer that is formed in each sub-pixel and emits green light, or a B-organic light emitting layer that is formed in each sub-pixel and emits blue light. Also, the organic light emitting layer 313 may be a W-organic light emitting layer for emitting white light.

The organic light emitting layer 313 may include the light emitting layer and may also include an electron injection layer and a hole injection layer to inject electrons and holes, respectively, into the light emitting layer. For example, an electron transport layer and a hole transport layer transport the injected electrons and holes, respectively, into the organic layer.

A cathode electrode 314 is formed on the organic light emitting layer 313. The cathode electrode 314 may be formed of a transparent conductive material such as indium tin oxide (ITO) or indium zinc oxide (IZO) or a thin metal through which visible light is transmitted, but is not limited thereto.

The encapsulation layer portion 380 is formed over the cathode electrode 314. The encapsulation layer portion 380 may be composed of a single layer of an inorganic layer, may be composed of two layers of an inorganic layer and an organic layer, or may be composed of three layers of an inorganic layer, an organic layer, and an inorganic layer. The inorganic layer may be formed of an inorganic material such as SiNx and SiX, but is not limited thereto. In addition, the organic layer may be formed of an organic material such as polyethylene terephthalate, polyethylene naphthalate, polycarbonate, polyimide, polyethylene sulfonate, polyoxymethylene, polyarylate, or a mixture thereof, but is not limited thereto.

An example of the encapsulation layer portion 380 is illustrated in FIG. 3 and includes three layers of an inorganic layer 321a, an organic layer 321b, and an inorganic layer 321c.

A touch panel 390 may be further formed on the encapsulation layer portion 380. A touch buffer insulating layer 322 may be formed on the encapsulation layer portion 380 as a base for the touch panel 390.

The touch input signal wire and the touch reception signal wire are disposed on an inorganic insulating layer 323 to sense a touch signal.

When the touch input signal wire and the touch reception signal wire are formed, a fourth electrode pad layer 325p may be further formed in the pad area PA.

The touch panel 390 may include a touch electrode wire 325a and a bridge wire 325b. The touch electrode wire 325a and the bridge wire 325b may be connected to each other with a third interlayer insulating layer 324 interposed therebetween.

The touch electrode wire 325a and the bridge wire 325b may be protected from the outside while being covered by the fourth interlayer insulating layer 327.

As a result, referring to FIG. 3, the electrode pad 210 of the pad area PA may stack the first electrode pad layer 307p, the second electrode pad layer 308p, the third electrode pad layer 310p, and the fourth electrode pad layer 325p. The first electrode pad layer 307p may include the same material as the gate electrode 307, the second electrode pad layer 308p that may include the same material as the source electrode 308S and the drain electrode 308D, the third electrode pad layer 310p may include the same material as the connection electrode 310, and the fourth electrode pad layer 325p having the same material as the touch electrode wire 325a are stacked.

In addition, the separation area DA divides the wire trace 201 into the first portion 201a of the wire trace and the second portion 201b of the wire trace and includes the connection wire 230 that connects divided portions of the conductive wire trace 307C to each other. Accordingly, because the wire trace 201 includes the separation area DA, it is possible to prevent corrosion and electric erosion from propagating through the wire trace 201 during the manufacturing process of the array substrate SUB and it is possible to prevent occurrence of inorganic layer delamination during the cutting process.

In some aspects, the inorganic layers between the first portions 201a of the wire traces are removed. That is, because the inorganic layers between the first portions 201a of the wire traces are removed, an impact generated during a grinding process of the array substrate SUB may be insulated and prevent transmission of the impact to an inside of the array substrate SUB and prevent delamination of inorganic layers during the grinding process. A detailed description thereof will be described with reference to FIGS. 4A to 4C.

Figure 4A:
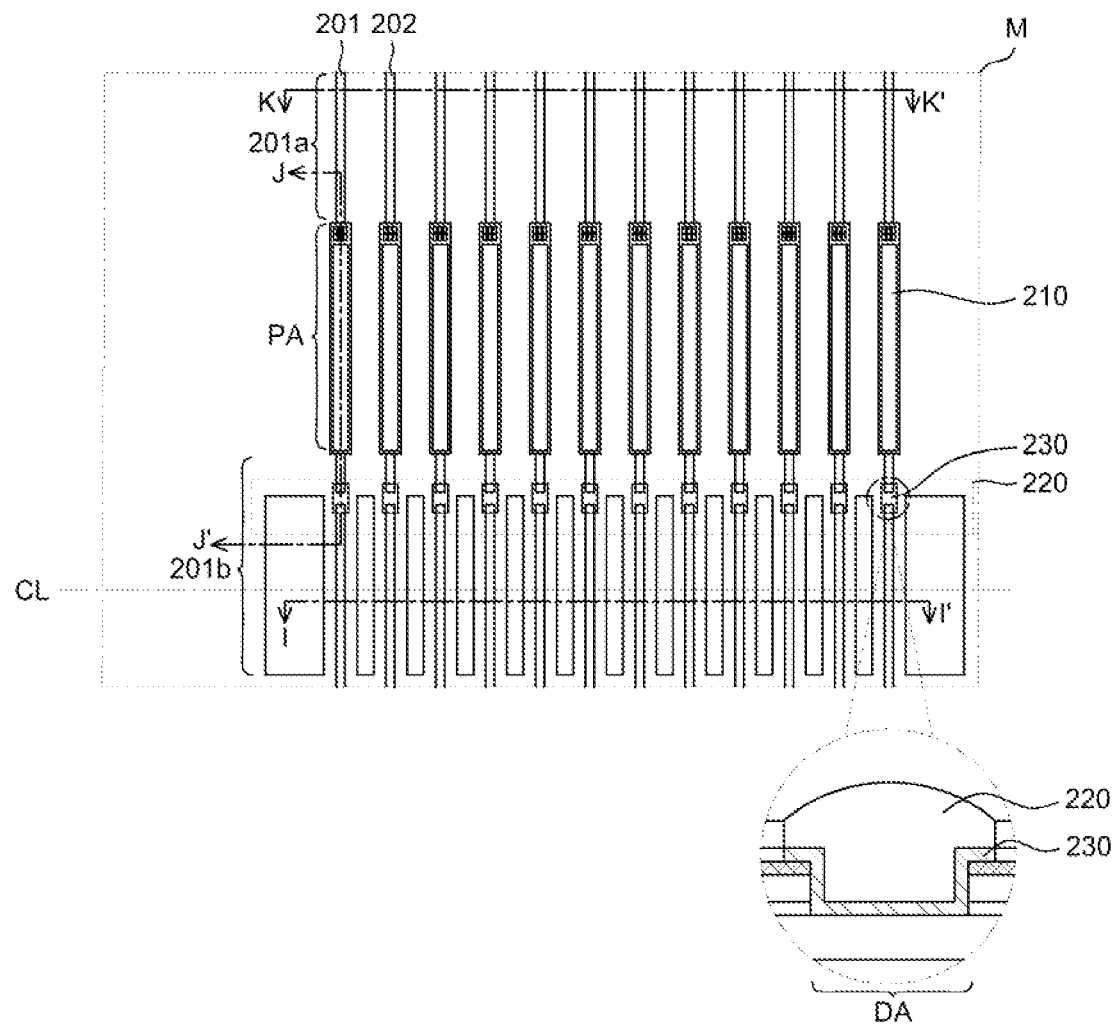
FIG. 4A is an enlarged view including cut lines of the area M of FIG. 1.
Figure 4B:
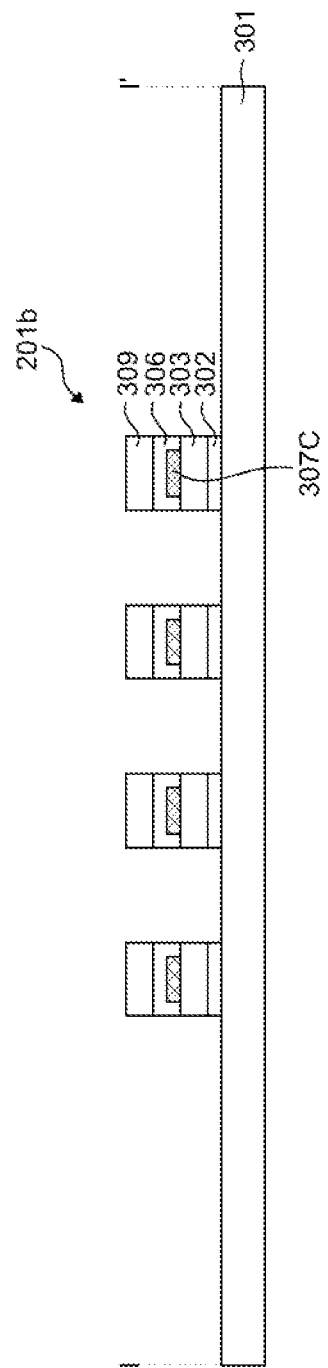
FIG. 4B is a cross-sectional view of a substrate taken along cutting line I-I' of FIG. 4A.
Figure 4C:
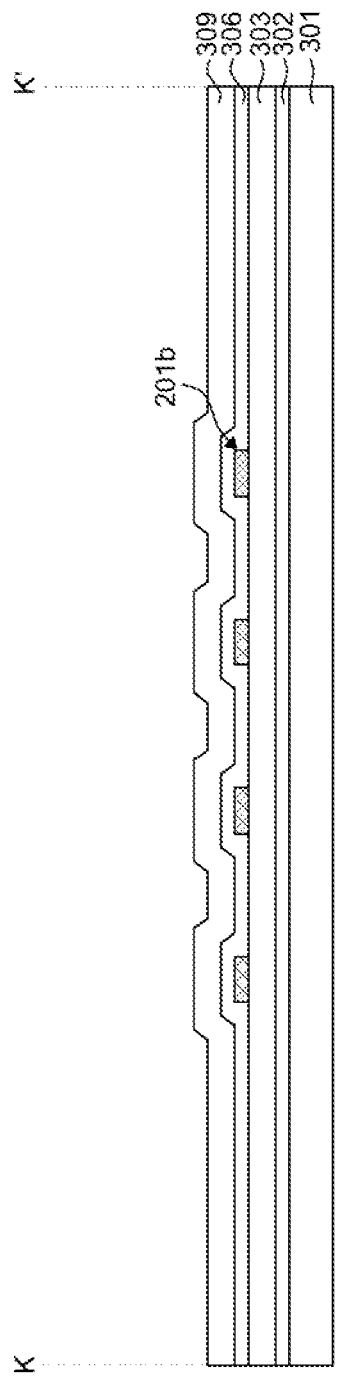
FIG. 4C is a cross-sectional view of the substrate taken along cutting line K-K' of FIG. 4A.

FIG. 4A is a plan view of area M, FIG. 4B is a cross-sectional view of the second portion 201b of the wire trace in the area M taken along cutting line I-I', and FIG. 4C is a cross-sectional view of the first portion 201a of the wire trace in the area M taken along cutting line K-K'.

Referring to FIG. 4B, the inorganic insulating layers between the second portions 201b of the respective wire traces are removed to expose the base substrate 301. Specifically, referring to FIG. 4B, the lower buffer layer 302, the gate insulating layer 303, the first interlayer insulating layer 306, and the second interlayer insulating layer 309 that are formed between the second portions 201b of the wire traces are removed to expose the base substrate 301. The removal of these inorganic insulating layers continues up to the separation area DA. The second portion 201b of the wire trace forms a stacking structure of the lower buffer layer 302, the gate insulating layer 303, the conductive wire trace 307C, the first interlayer insulating layer 306, and the second interlayer insulating layer 309.

Meanwhile, referring to FIG. 4C, the first portion 201a of the wire trace in the area M is viewed through cut line K-K'.

As shown in FIG. 4C, the inorganic insulating layers exist between the first portions 201a of the respective wire traces. That is, the inorganic insulating layers between the first portions 201a of the respective wire traces fill spaces between the first portions 201a of the respective wire traces without being removed.

As a result, the inorganic insulating layers between the pad area PA and an end portion of the base substrate 301 are removed, an transmission of an impact to an inside of the display panel during the cutting process can be prevented. In some aspects, the inorganic insulating layers that are disposed in a direction toward the active area PA from the pad area PA cover the wire traces to protect the wire traces.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only and not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting diode display device, comprising:
   a substrate including an active area and a non-active area;
   a thin film transistor disposed in the active area and including a semiconductor pattern, a gate electrode overlapping the semiconductor pattern, and a source electrode and a drain electrode electrically connected to the semiconductor pattern;
   a planarization layer disposed on the thin film transistor;
   a light emitting element portion disposed on the planarization layer and connected to the thin film transistor;
   a plurality of wire traces extending from the non-active area to the active area; and
   a pad area including electrode pads connected to the plurality of wire traces,
   wherein a wire trace of the plurality of wire traces includes (i) a first portion extending to the active area and connected to the pad area and (ii) a second portion extending to an end portion of the substrate,
   wherein the first portion of the wire trace and the second portion of the wire trace are separated from each other by a separation area between the pad area and the end portion of the substrate, and are electrically connected by a connection wire in the separation area, and
   wherein a portion of the connection wire in the separation area comprises a non-planar surface.

2. The organic light emitting diode display device of claim 1, wherein the wire trace includes a conductive wire trace, at least one interlayer insulating layer covering the conductive wire trace, and at least one lower insulating layer disposed between the substrate and the conductive wire trace.

3. The organic light emitting diode display device of claim 2, wherein the at least one interlayer insulating layer and the at least one lower insulating layer include an inorganic material.

4. The organic light emitting diode display device of claim 3, wherein the separation area between the first portion of the wire trace and the second portion of the wire trace includes a recess from which the conductive wire trace and the at least one interlayer insulating layer and the at least one lower insulating layer have been removed.

5. The organic light emitting diode display device of claim 4,
   wherein the gate electrode is disposed on a gate insulating layer overlapping the semiconductor pattern,
   wherein the separation area includes the recess from which the gate insulating layer has been removed, and
   wherein the connection wire is disposed in the recess.

6. The organic light emitting diode display device of claim 1, wherein an organic protective layer pattern is disposed on the connection wire of the wire trace.

7. The organic light emitting diode display device of claim 2, wherein the at least one lower insulating layer and the at least one interlayer insulating layer are removed between the second portions of adjacent wire traces among the plurality of wire traces to thereby expose the substrate.

8. The organic light emitting diode display device of claim 2, wherein the substrate is covered by the at least one lower insulating layer or the at least one interlayer insulating layer between the first portions of adjacent wire traces among the plurality of wire traces.

9. The organic light emitting diode display device of claim 2, wherein the conductive wire trace includes at least one of conductive materials disposed between the semiconductor pattern and the light emitting element portion.

10. The organic light emitting diode display device of claim 9, wherein the conductive wire trace is made of a same material as the gate electrode.

11. The organic light emitting diode display device of claim 9, wherein the connection wire of the wire trace includes at least one of conductive materials disposed between the gate electrode and the light emitting element portion.

12. The organic light emitting diode display device of claim 11, wherein the connection wire of the wire trace is made of a same material as the source electrode and the drain electrode.

13. The organic light emitting diode display device of claim 1, wherein each electrode pad of the electrode pads includes at least one of conductive materials disposed between the semiconductor pattern and the light emitting element portion.

14. The organic light emitting diode display device of claim 6, wherein the organic protective layer pattern is made of a same material as the planarization layer.

15. The organic light emitting diode display device of claim 6, wherein a flexible printed circuit board (FPCB) is mounted to at least one electrode pad in the pad area and extends to at least partially overlap the organic protective layer pattern.

16. The organic light emitting diode display device of claim 1, wherein the second portion of the wire trace is exposed at the end portion of the substrate.

17. The organic light emitting diode display device of claim 1, wherein the non-planar surface of the connection wire is configured to insulate the organic light emitting diode display device from impacts during grinding of the substrate.

* * * * *